US006928012B2

United States Patent
Camacho et al.

(10) Patent No.: US 6,928,012 B2
(45) Date of Patent: Aug. 9, 2005

(54) BITLINE EQUALIZATION SYSTEM FOR A DRAM INTEGRATED CIRCUIT

(75) Inventors: Stephen M. Camacho, Durham, NC (US); Paul E. Brucke, Durham, NC (US)

(73) Assignee: Infineon Technologies AG, Munich (DE)

( * ) Notice: Subject to any disclaimer, the term of this patent is extended or adjusted under 35 U.S.C. 154(b) by 376 days.

(21) Appl. No.: 10/259,100

(22) Filed: Sep. 27, 2002

(65) Prior Publication Data

US 2004/0062073 A1 Apr. 1, 2004

(51) Int. Cl.[7] .................................................. G11C 7/00
(52) U.S. Cl. ........................................ 365/203; 365/190
(58) Field of Search ................................ 365/203, 190, 365/149, 63

(56) References Cited

U.S. PATENT DOCUMENTS

| | | | | |
|---|---|---|---|---|
| 4,656,608 A | * | 4/1987 | Aoyama | 365/190 |
| 5,367,488 A | * | 11/1994 | An | 365/189.01 |
| 5,506,811 A | * | 4/1996 | McLaury | 365/233 |
| 6,118,713 A | * | 9/2000 | Raad | 365/201 |
| 6,307,768 B1 | * | 10/2001 | Zimmermann | 365/51 |
| 6,785,176 B2 | * | 8/2004 | Demone | 365/202 |

OTHER PUBLICATIONS

Brent Keeth, R. Jacob Baker; *Dram Circuit Design*; IEEE PRESS 1999, pp. 46–49.

* cited by examiner

Primary Examiner—Tan T. Nguyen
(74) Attorney, Agent, or Firm—Brinks Hofer Gilson & Lione

(57) ABSTRACT

A system for pre-charging and equalizing potentials on a bitline pair in a DRAM integrated circuit. The system includes an equalization circuit at one position on the bitline pair and another equalization circuit at another position on the bitline pair. As charge is distributed between the bitlines and to/from the pre-charge potential source through multiple conduction paths, the pre-charge and equalization time of the bitlines is reduced.

9 Claims, 5 Drawing Sheets

- PRIOR ART -

BITLINE EQUALIZATION SYSTEM FOR A DRAM INTEGRATED CIRCUIT

FIELD OF THE INVENTION

This invention relates to Dynamic Random Access Memory. More particularly the invention relates to a system for equalizing potentials on bitlines in Dynamic Random Access Memories.

BACKGROUND

Many electronic devices and systems include integrated circuits for the storage of data during the operation of the devices. For example, electronic devices such as computers, printing devices, scanning devices, personal digital assistants, calculators, computer work stations, audio and/or video devices, communications devices such as cellular telephones, and routers for packet switched networks may include memory in the form of integrated circuits for retaining data as part of their operation. Advantages of using integrated circuit memory compared to other forms of memory include space conservation and miniaturization, conserving limited battery resources, decreasing access time to data stored in the memory, and cutting the costs of assembling the electronic devices.

Dynamic Random Access Memory ("DRAM") is an example of integrated circuit memory. DRAM typically comprises an array of semiconductor capacitor cells, each of which may hold an amount of electric charge that represents the logical value of a stored bit. The cells in the array are typically arranged in rows and columns. Each cell is situated at the intersection of a row and a column. Each cell in the DRAM array may be accessed by simultaneously addressing the intersecting row and column.

In operation, internal amplifiers in the DRAM sense the amounts of electric charges stored on the capacitors. Based on the sensed electric charges, the outputs of the sense amplifiers represent the logical values of the bits that are stored in the DRAM array. In this manner, the data stored in the array may be extracted from the DRAM integrated circuit for use by other integrated circuits in the electronic device. In addition, other internal circuitry on the DRAM refreshes the charge on those cells that the sense amplifiers have determined to already hold an electric charge. In this manner, the DRAM compensates for leakages of electric charge from the semiconductor capacitor cells, such as leakage into the substrate of the DRAM integrated circuit. Such reading, writing, and maintaining of charge on the cells are substantial internal operations of the DRAM.

The sense amplifiers connect to the cells through bitlines, which comprise the columns of the DRAM. Before reading from a cell, the DRAM removes residual charge on the bitline that addresses the cell. The residual charge is left over from a previous reading of another cell that shares the same bitline. The DRAM equalizes the bitline by pre-charging the bitline to a common potential before reading from the cell. When the DRAM addresses the cell, the charge stored in the cell raises or lowers the potential of the bitline from the common potential, signifying the logic value of the bit stored in the cell.

Bitlines, however, have internal resistance, internal parasitic capacitance, and parasitic capacitance with other bitlines. The resistances and capacitances comprise an RC circuit whose time constant increases the equalization time for pre-charging the bitlines. If too large, the time constant results in a slower read time for the DRAM integrated circuit that limits the use of the DRAM integrated circuit in modern high-speed electronic devices. As clock speeds for DRAM integrated circuits increase, the minimum time between commands lessens and the equalization times for bitlines should likewise decrease. Therefore, there is a need for decreasing the pre-charge time for the bitlines.

SUMMARY

In order to address deficiencies in the prior art, a system is provided for equalizing charges on a bitline pair to provided a decreased pre-charge time.

One aspect of the invention is a bitline equalization system for pre-charging a bitline and a complementary bitline to an equalization potential in a DRAM integrated circuit. The bitline equalization system includes a first equalization circuit connected between a first position along the bitline and a corresponding first position along the complementary bitline. The bitline equalization system also includes a second equalization circuit connected between a second position along the bitline and a corresponding second position along the complementary bitline. The first position is closer to a beginning of the bitline than the second position, and the first complementary position is closer to a beginning of the complementary bitline than the second complementary position.

Another aspect of the invention is a bitline equalization system for pre-charging a bitline and a complementary bitline to an equalization potential in a DRAM integrated circuit. The bitline equalization system includes means for exchanging charge between the bitline and an equalization potential at a first position along the bitline. The system also includes means for exchanging charge between the complementary bitline and the equalization potential at a corresponding first position along the complementary bitline, and means for exchanging charge between a second position along the bitline and a corresponding second position along the complementary bitline. The first position is closer to a beginning of the bitline than the second position, and the first complementary position is closer to a beginning of the complementary bitline than the second complementary position.

The foregoing and other features and advantages of preferred embodiments of the present invention will be more readily apparent from the following detailed description, which proceeds with reference to the accompanying drawings.

DETAILED DESCRIPTION OF THE PRESENTLY PREFERRED EMBODIMENTS

Figure 1:
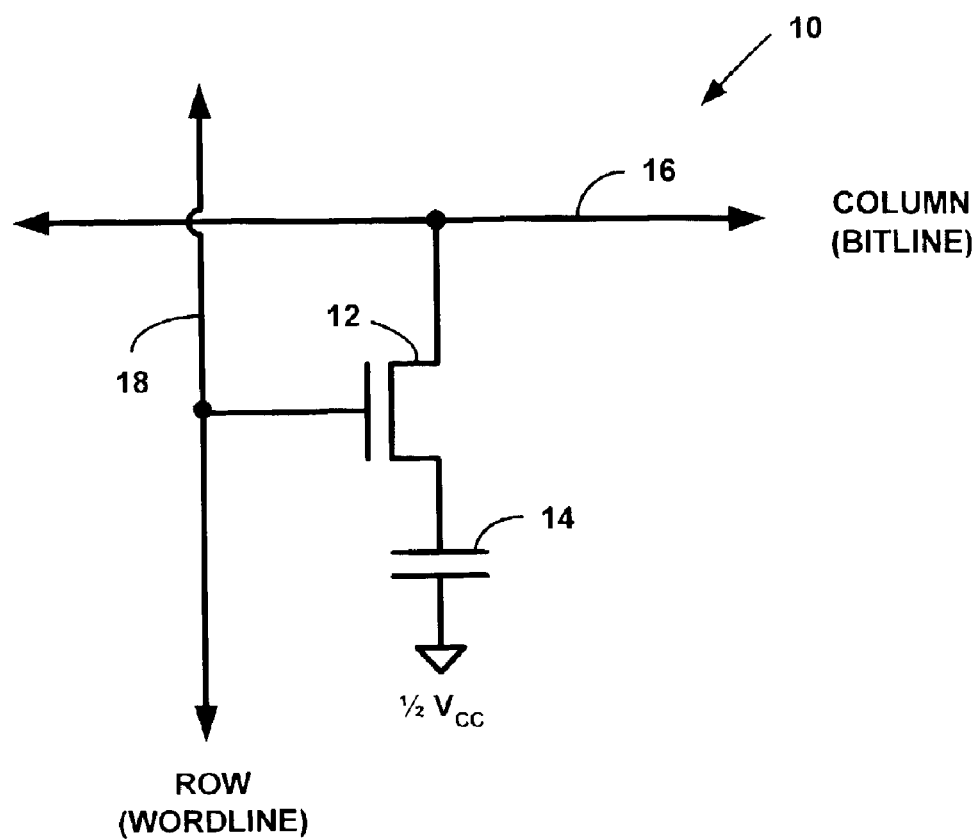
FIG. 1 is a diagram illustrating a preferred configuration of a memory cell in a DRAM array.

FIG. 1 is a diagram illustrating a preferred configuration of a memory cell 10 in a DRAM array. The memory cell 10 in this example includes an N-type metal oxide semiconductor ("MOS") transistor 12 and a capacitor 14. The transistor 12 and capacitor 14 may be formed on a substrate using fabrication techniques known to those of ordinary skill in the DRAM fabrication art. A first end of the MOS transistor 12 conduction path connects to a plate of the capacitor 14. A second end of the MOS transistor 12 conduction path connects to a column conduction path 16 that is common to all cells 10 that are associated in a column. For N-type MOS transistors 12, the end of the conduction path that is at a higher potential relative to the other end is commonly referred to as a "drain" by those of ordinary skill in the art, and the other end of the conduction path is commonly referred to as a "source."

The column conduction path 16 is often termed a "bitline" by those of ordinary skill in the DRAM fabrication art. The gate of the MOS transistor 12 connects to a row conduction path 18 that is common to all cells 10 that are associated in a row. The row conduction path 18 is often termed a "wordline" by those of ordinary skill in the DRAM fabrication art. It should be understood by one of ordinary skill in the art that the orientation of the rows and columns as shown in FIG. 1 are rotated by ninety degrees from the usual meaning of their orientation for the purpose of more fully describing the preferred embodiments to be described below.

The DRAM maintains the other plate of the capacitor 14 at a potential that is half the power supply voltage. The internal power supply voltage is referred to as $V_{CC}$ by those of ordinary skill in the art. Storing a logic value of one in the cell 10 includes raising the bitline 16 to a potential of $V_{CC}$ and raising the wordline 18 to a higher potential, $V_{CCP}$. $V_{CCP}$ is a potential that will enable the transistor 12 to conduct throughout the charging process. The transistor 12 conducts and the upper plate of the capacitor 14 is charged to a potential of $V_{CC}$. Storing a logic value of zero in the cell 10 includes lowering the bitline 16 to a potential of zero and raising the wordline 18 to $V_{CCP}$. The transistor 12 conducts and the upper plate of the capacitor 14 is discharged to zero potential through the transistor 12.

Reading the logic value stored in the cell 10 includes raising the potential on the wordline 18 to $V_{CCP}$. The transistor 12 conducts, transferring charge between the capacitor 14 and the bitline 16. A sense amplifier (not shown) detects a change in potential of the bitline 16, amplifies the change, and provides an output representative of the logic value that was stored in the memory cell 10. In a preferred embodiment of the memory cell 10, the bitline 16 is pre-charged to a potential of ½$V_{CC}$ before the wordline 18 potential rises to initiate the reading process. If a logic value of one was stored in the cell 10, the potential on the upper plate of the capacitor 14 is expected to be greater than ½$V_{CC}$, having fallen from $V_{CC}$ due to leakage. In this case, the potential on the bitline 16 will rise slightly from ½$V_{CC}$. Alternatively, if a logic value of zero was stored in the cell 10, the potential on the upper plate of the capacitor 14 is expected to be less than ½$V_{CC}$, having risen from zero due to leakage. In this case, the potential on the bitline 16 will fall slightly from ½$V_{CC}$. The sense amplifier detects the slight rise or fall of potential on the bitline 16 and outputs a potential corresponding to a logic value of one or zero accordingly.

Figure 2:
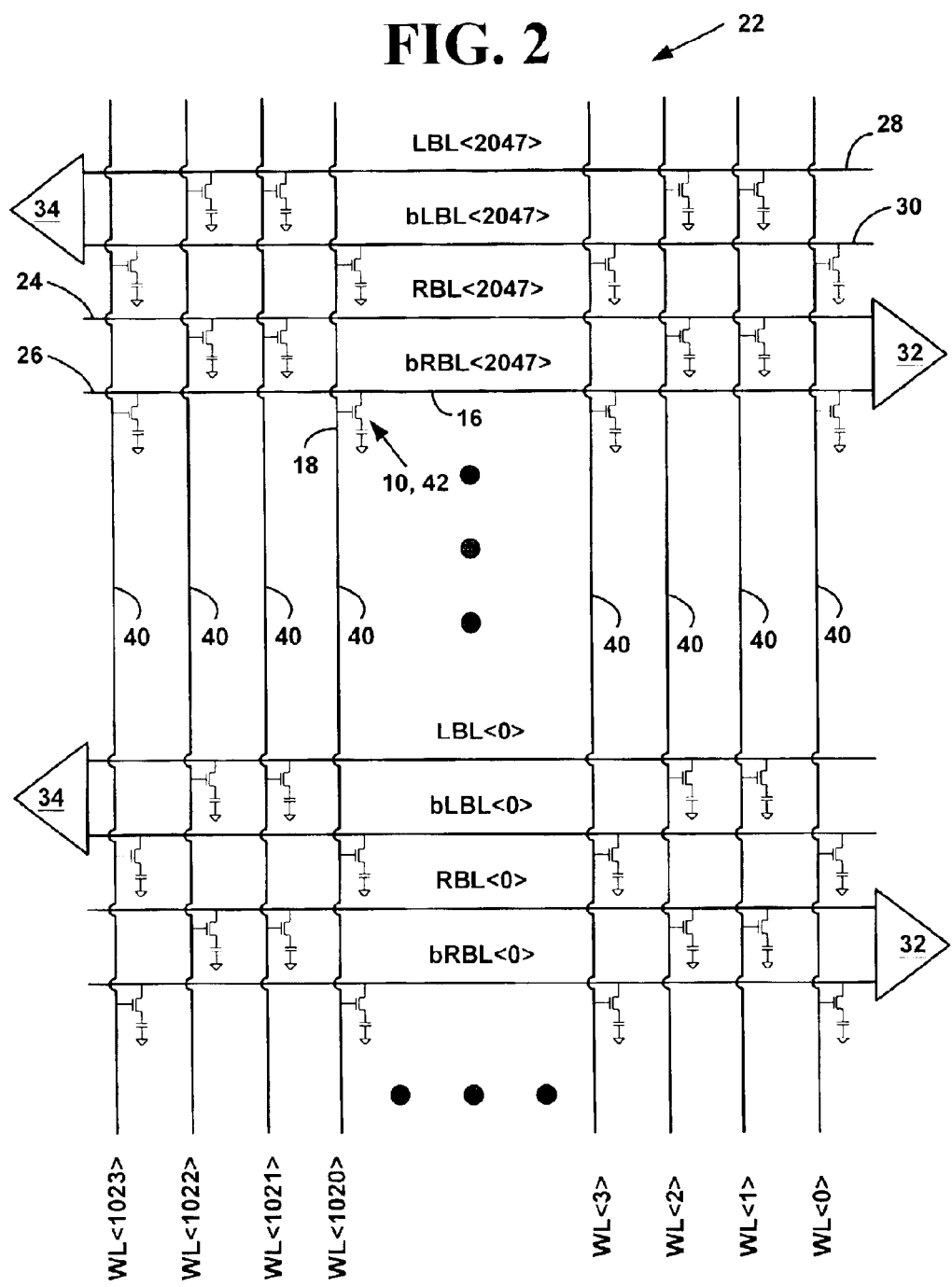
FIG. 2 is a diagram illustrating a preferred configuration of a memory section of a DRAM array.

FIG. 2 is a diagram illustrating a preferred configuration of a memory section 22 of a DRAM integrated circuit. An example of a DRAM integrated circuit is a sixty-four Megabit ("Mb") DRAM array, where one Megabit is $2^{20}$ bits or 1,048,576 bits. FIG. 2 illustrates a 4 Mb memory section 22 of the DRAM array, sixteen of which comprise the 64 Mb DRAM integrated circuit. The memory section 22 may have a left neighboring section (not shown) and a right neighboring section (not shown). Sections 22 at the edge of the die of the DRAM integrated circuit ordinarily lack a left or right neighboring section. It should be understood that the DRAM array of the present invention is not restricted to the configuration of memory cells 10 in the DRAM array 20 as depicted in FIG. 2 and that other configurations of the DRAM array are possible. For example, each crossing of a bitline 16 and a wordline 18 may be connected to a memory cell 10.

Dividing the DRAM integrated circuit into memory sections 22 provides shorter bitlines and/or wordlines than if the lines ran across the whole DRAM array. Long lines may have large resistances, internal parasitic capacitances, and parasitic capacitances with neighboring lines that reduce the performance of the DRAM array. It should be understood, however, that the exemplary memory sizes of 64 Mb DRAM arrays and 4 Mb sections 22 are for illustrative purposes only and that other array and section sizes are contemplated.

In a preferred arrangement of bitlines within the section 22, alternate pairs of bitlines exit the section 22 in opposing directions. One selection of bitlines exits the section 22 to the right of the section 22. These bitlines are termed 'right bitlines' 24 ("RBLs") and 'right complementary bitlines' 26 ("bRBLs") by those of ordinary skill in the art. Another selection of bitlines exits the section 22 to the left of the section 22. These bitlines are termed 'left bitlines' 28 ("LBLs") and 'left complementary bitlines' 30 ("bLBLs"). Each RBL 24 and bRBL 26 connects to a sense amplifier 32, termed a 'right sense amplifier' 32 by those of ordinary skill in the art. Each LBL 28 and bLBL 30 connects to a sense amplifier 34, often termed a 'left sense amplifier' 34 by those of ordinary skill in the art. Bitlines paired with complementary bitlines are termed 'bitline pairs' by those of ordinary skill in the art. Those of ordinary skill in the art call the memory section 22 shown in FIG. 2 a 'folded digitline' configuration.

In a preferred embodiment of the DRAM array, neighboring memory sections 22 share common sense amplifiers 32, 34. For example, RBLs 24 and bRBLs 26 of the section 22 share sense amplifiers 32 with the LBLs 28 and bLBLs 30 of the right neighboring section. Also, LBLs 28 and bLBLs 30 of the section 22 share sense amplifiers 34 with the RBLs 24 and bRBLs 26 of the left neighboring section. This sharing of sense amplifiers 32, 34 cuts the number of required sense amplifiers 32, 34 for the DRAM array by a factor of approximately two. If the DRAM array does not fire more than one wordline 40 at a time, the sense amplifiers 32, 34 do not encounter ambiguities regarding from which section 22 they are reading.

The memory section 22 includes wordline drivers (not shown), which raise the potential on the gates of the transistors 12 in a row substantially to $V_{CCP}$ for reading, writing, or refreshing the memory cells 10 in the memory section 22. The memory section 22 also includes write drivers (not shown) for raising or lowering the potentials on the bitlines 36 that charge the capacitors 14 of memory cells 10 to potentials corresponding to logic values of one or zero.

In the memory section 22 shown in FIG. 2, a memory cell 10 connects to each crossing point of a wordline 40 and a bitline 24–30. The exemplary 4 Mb memory section 22 comprises 1024 wordlines 40, labeled WL<0> to WL<1023>. The memory section 22 also comprises 8192 bitlines 24–30, themselves comprising 2048 quartets of bitlines 24–30. Each quartet includes: a LBL 28, the 2048 LBLs 28 being labeled LBL<0> to LBL<2047>; a bLBL 30, the 2048 bLBLs 30 being labeled bLBL<0> to bLBL<2047>; a RBL 24, the 2048 RBLs 24 being labeled RBL<0> to RBL<2047>; and a bRBL 26, the 2048 bRBLs 26 being labeled bRBL<0> to bRBL<2047>.

In operation, a memory cell 10, for example memory cell 42 at the juncture of WL<1020> and bRBL<2047>, stores a logic value. In order to detect the logic value stored in this memory cell 42, the right sense amplifier 32 detects a difference in potentials between the RBL 24 at RBL<2047> and its complement bRBL 26 at bRBL<2047> when potential of the wordline 40 at WL<1020> is raised to read out the stored logic value from the cell 42. As is known to those of ordinary skill in the art, the arrangement of measuring the difference in voltage between complementary bitlines 24, 26 reduces noise at the sense amplifier 32 and improves the efficiency of the reading process on the DRAM integrated circuit.

Before reading from the memory cell 42, residual charge on the bitline pair 24, 26 is removed. The residual charge arises from read operations on other cells that share the bitline. For example, if the sense amplifier 32 previously read a logical value of one from another cell on bRBL<2047>, the potential of bRBL<2047> is higher than one half $V_{CC}$ because charge is deposited from the previously read cell onto the bRBL 26. Due to the internal capacitance of the bitline and the input impedance of the sense amplifier 32, the charge may remain on bRBL<2047>. When the memory cell 42 is opened for reading, the residual charge on bRBL<2047> may interfere with the measurement of the charge that resides in the memory cell 42. For example, if the memory cell 42 stores a logical value of zero, the potential on the cell's 42 capacitor 14 should be just below one half $V_{CC}$. However, positive residual charge on bRBL<2047> from the previous reading may partially or fully negate the potential difference and give a false reading at the sense amplifier 32.

The DRAM equalizes the bitline pair 24, 26 by pre-charging the bitline pair 24, 26 to a common potential before reading from the memory cell 42. When the DRAM addresses the memory cell 42, the charge stored in the cell 42 raises or lowers the potential of the bitline pair 24, 26 from the common potential, signifying the logic value of the bit stored in the cell 42.

It should be understood, however, that the selection of wordline 40 WL<1020>, right bitline 24 RBL<2047>, complementary right bitline 26 bRBL<2047>, and memory cell 42 are for illustrative purposes only and that the method and system of the present invention are not limited to these components. For example, the present invention may be applied to any right or left bitline pair in a DRAM array.

Bitline Equalization

Figure 3:
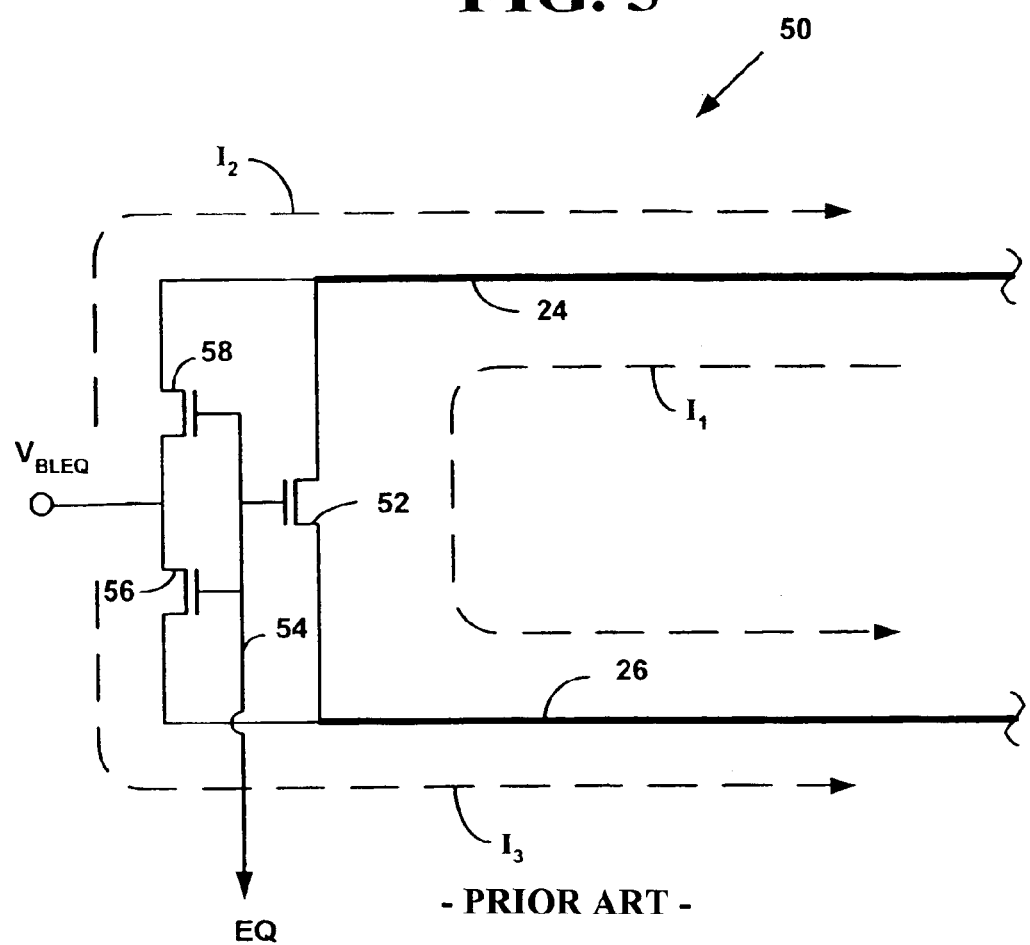
FIG. 3 is a diagram illustrating a prior art bitline equalization system.

FIG. 3 is a diagram illustrating a prior art bitline 24–30 equalization system 50. For example, an equalization circuit 52–58 connects to one end of a right bitline pair 24, 26 and to a voltage source at a common potential $V_{BLEQ}$ for the bitlines 24, 26 to attain after equalization. The end of the bitline pair 24, 26 is an end of the bitline 24 and an end of the complementary bitline 26 that corresponds to the end of the bitline 24. A typical value for $V_{BLEQ}$ is half of $V_{CC}$ as the capacitors 14 in the memory cells 42 are charged above or below one half $V_{CC}$ to store a logical value of one or zero respectively.

The bitline equalization system 50 operates when the equalization line 54 is at a high potential, such as $V_{CC}$. The bitlines 24, 26 exchange charge through a first conducting transistor 52, the flow of charge shown as a first current $I_1$. Charge also flows to and from the voltage source to the RBL 24 as a second current $I_2$ through a second conducting transistor 58, and to and from the voltage source to the complementary bitline bRBL 26 as a third current $I_3$ through a third conducting transistor 56. Since the prior art equalization circuit 52–58 connects to one end of the bitline pair 24, 26, the slowest equalization is at the other end of the bitline pair 24, 26, farthest from the equalization circuit 52–58, due to the resistances and parasitic capacitances of the bitlines 24, 26. Thus the single equalization circuit 52–58 at one end of the bitline pair 24, 26 does not bring the complete length of the bitline pair 24, 26 to $V_{BLEQ}$ as efficiently as possible.

Figure 4:
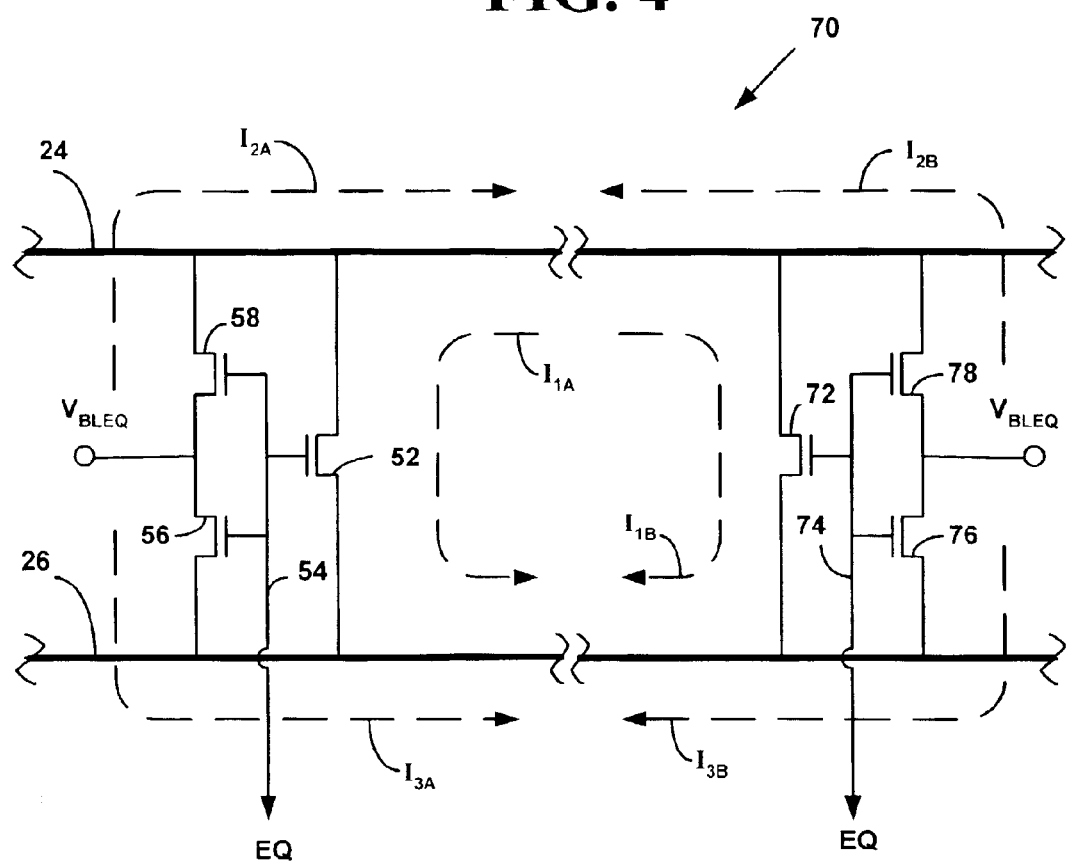
FIG. 4 is a diagram illustrating a preferred bitline equalization system.

FIG. 4 is a diagram illustrating a preferred bitline equalization system 70. The bitline equalization system 70 includes a first equalization circuit 52–58 at a first position along the bitline pair 24, 26, and a second equalization circuit 72–78 at a second position along the bitline pair 24, 26. The first position along the bitline pair 24, 26 relates to a first position on the bitline 24 and a first position on the complementary bitline 26 that corresponds to the first position the bitline 24. The second position along the bitline pair 24, 26 relates to a second position on the bitline 24 and a second position on the complementary bitline 26 that corresponds to the second position the bitline 24. The first and second positions along the bitline pair 24, 26 need not correspond to ends of the bitline pair 24, 26. In a preferred embodiment, the first position is closer to a beginning of the bitline than the second position, and the first complementary position is closer to a beginning of the complementary bitline than the second complementary position.

The bitline equalization system 70 operates when the equalization lines 54, 74 are at a high potential, such as $V_{CC}$. In a preferred embodiment, the equalization lines 54, 74 are a shared equalization line that is commonly electrically connected to the gates of the transistors 52, 56, 58, 72, 76, 78 as shown in FIG. 4. In the preferred system 70, the bitlines 24, 26 exchange charge through the first conducting transistor 52 and through a fourth conducting transistor 72, the flows of charge shown as first currents $I_{1A}$ and $I_{1B}$. Charge also flows to and from the voltage source to the RBL 24 as second currents $I_{2A}$ and $I_{2B}$ through the second conducting transistor 58 and a fifth conducting transistor 78. Charge also flows to and from the voltage source to the complementary bitline bRBL 26 as third currents $I_{3A}$ and $I_{3B}$ through the third conducting transistor 56 and a sixth conducting transistor 76. Since the preferred equalization system 70 electrically connects to two positions along the bitline pair 24, 26, and not to only one end of the bitline pair 24, 26, the pre-charge and equalization time is reduced compared to the prior art equalization system 50 of FIG. 3. The equalization time reduced because there are more paths for charge to flow between the bitline pair 24, 26 compared to the prior art system 50. The pre-charge time is reduced because charge flows to and from the voltage source at multiple positions along the bitline pair 24, 26 compared to the prior art system 50.

Figure 5:
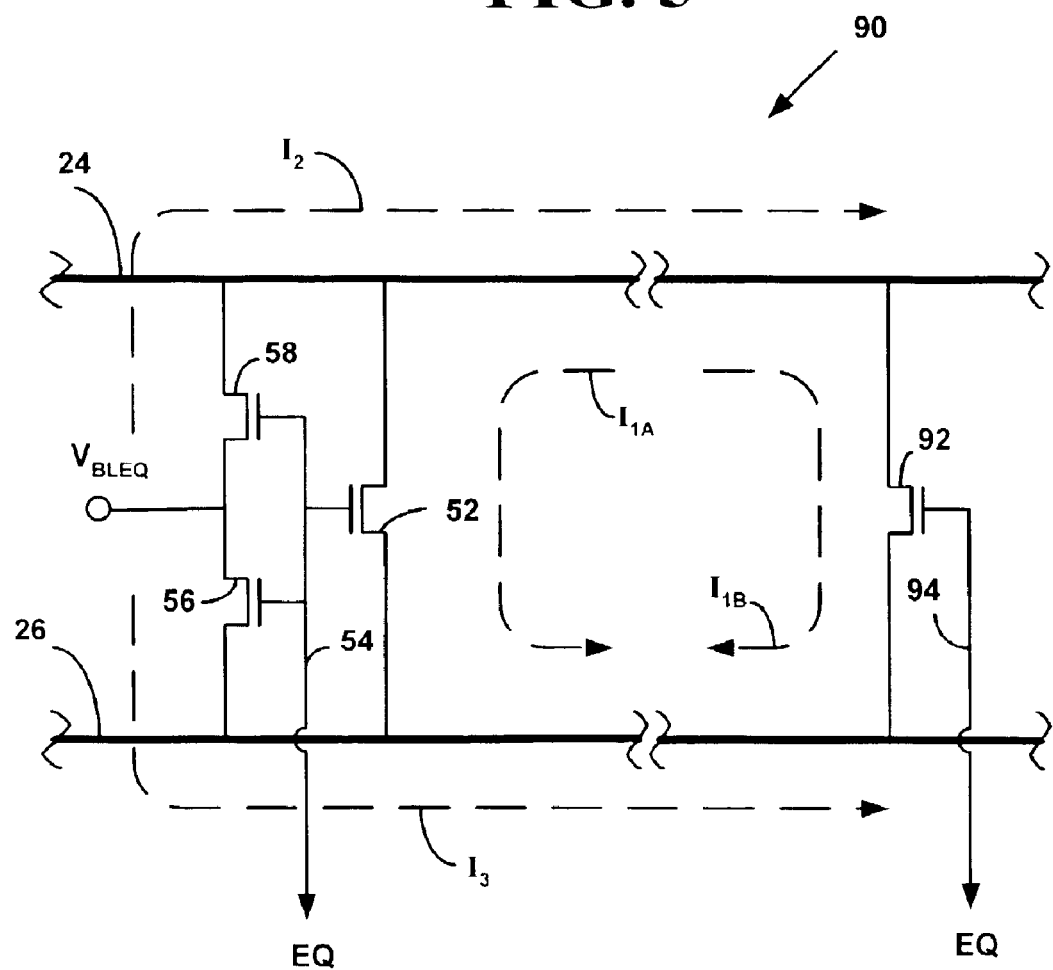
FIG. 5 is a diagram illustrating another preferred bitline equalization system.

FIG. 5 is a diagram illustrating another preferred bitline equalization system 90. The other bitline equalization system 90 includes a first equalization circuit 52–58 at one end of the bitline pair 24, 26, and an equalization transistor 92 at the other end of the bitline pair 24, 26. The bitline equalization system 90 operates when the equalization lines 54, 94 are at a high potential, such as $V_{CC}$. In a preferred embodiment, the equalization lines 54, 94 are a shared equalization line that is commonly electrically connected to the gates of the transistors 52, 56, 58, 92 as shown in FIG.

5. In the system 90 of FIG. 5, the bitlines 24, 26 exchange charge through the first conducting transistor 52 and through the equalizing transistor 92, the flows of charge shown as first currents $I_{1A}$ and $I_{1B}$. Charge also flows to and from the voltage source to the bitline RBL 24 as the second current $I_2$ through the second conducting transistor 58, and to and from the voltage source to the complementary bitline bRBL 26 as the third current $I_3$ through the third conducting transistor 56. Since the other equalization system 90 of FIG. 5 connects to both ends of the bitline pair 24, 26, the pre-charge and equalization time is reduced compared to the prior art equalization system 50 of FIG. 3.

The placement of the equalization circuits 52–58, 72–78, and/or transistors 92 along the bitline pair 24, 26 may depend on the distribution of wordlines 40 on the memory section 22 of the DRAM integrated circuit. For example, in one structure of the memory array, the equalization circuits 52–58, 72–78, 92, are at the beginning and end of the bitline pair 24, 26. Placing the equalization circuits 52–58, 72–78, 92 at either end may save space on the memory array by not intervening between adjacent wordlines 40. Alternatively, the equalization circuits 52–58, 72–78, 92 may be equally distributed along the bitline pair 24, 26, such as at a quarter and three-quarters distance along the bitline pair 24, 26. In a preferred embodiment for the placement of multiple equalization circuits 52–58, 72–78, and/or transistors 92 along the bitline pair 24, 26, the equalization circuits 52–58, 72–78, and/or transistors 92 are distributed equally along the bitline pair 24, 26.

It should be understood, however, that the invention is not limited to equalization circuits and equalization transistors as depicted in FIGS. 4 and 5 and that other forms of equalization circuits for allowing charge to flow between the bitline pair 24, 26 and/or connecting the bitline pair 24, 26 to a voltage source are contemplated. For example, the equalization circuits may include CMOS transmission gates, familiar to those of ordinary skill in the art. Alternatively, the equalization circuit may take the form of any electronic circuit that electrically connects the bitline pair 24, 26 together at a position along the bitline pair 24, 26 and/or connects the bitline pair 24, 26 to a voltage source at the position along the bitline pair 24, 26. Such an electronic circuit connects the bitline pair 24, 26 together and/or connects the bitline pair 24, 26 to the voltage source in response to a high potential on an equalization line.

The foregoing detailed description is merely illustrative of several embodiments of the invention. Variations of the described embodiments may be encompassed within the purview of the claims. More or fewer elements or components may be used in the block or schematic diagrams. Accordingly, any description of the embodiments in the specification should be used for general guidance, rather than to unduly restrict any broader descriptions of the elements in the following claims.

We claim:

1. A bitline equalization system for pre charging a bitline and a complementary bitline to an equalization potential in a DRAM integrated circuit, the bitline equalization system comprising:

a first equalization circuit connected between a first position along the bitline and a corresponding first position along the complementary bitline, including
a first transistor having a first gate connected to a first equalization line, a first source connected to the first position along the bitline, and a first drain connected to the corresponding first position along the complementary bitline,
a second transistor having a second gate connected to the first equalization line, a second source connected to the first position along the bitline, and a second drain connected to the equalization potential,
a third transistor having a third gate connected to the first equalization line, a third source connected to the corresponding first position along the complementary bitline, and a third drain connected to the equalization potential; and a second equalization circuit connected between a second position along the bitline and a corresponding second position along the complementary bitline, the second equalization circuit including a fourth transistor having a fourth gate connected to a second equalization line, a fourth source connected to the second position alone the bitline, and a fourth drain connected to the corresponding second position on the complementary bitline,
a fifth transistor having a fifth gate connected to the second equalization line, a fifth source connected to the second position along the bitline, and a fifth drain connected to the equalization potential; and
a sixth transistor having a sixth gate connected to the second equalization line, a sixth source connected to the corresponding second position along the complementary bitline, and a sixth drain connected to the equalization potential,
wherein the first position is closer to a beginning of the bitline than the second position, and wherein the first complementary position is closer to a beginning of the complementary bitline than the second complementary position.

2. The bitline equalization system of claim 1, wherein the first equalization line and the second equalization line are a shared common equalization line.

3. The bitline equalization system of claim 1, wherein the first position along the bitline is the beginning of the bitline and the corresponding first position along the complementary bitline is the beginning of the complementary bitline.

4. The bitline equalization system of claim 1, wherein the second position along the bitline is an end of the bitline and the corresponding second position along the complementary bitline is an end of the complementary bitline.

5. The bitline equalization system of claim 1, wherein the distance between the second position along the bitline and an end of the bitline is substantially the same as the distance between the first position along the bitline and a beginning of the bitline, and wherein the distance between the second complementary position along the complementary bitline and an end of the complementary bitline is substantially the same as the distance between the first complementary position along the complementary bitline and a beginning of the complementary bitline.

6. A bitline equalization system for pre charging a bitline and a complementary bitline to an equalization potential in a DRAM integrated circuit, the bitline equalization system comprising:

means for exchanging charge between the bitline and an equalization potential at a first position along the bitline;

means for exchanging charge between the complementary bitline and the equalization potential at a corresponding first position along the complementary bitline; and means for exchanging charge between a second position along the bitline and a corresponding second position along the complementary bitline, wherein the first position is closer to a beginning of the bitline than the second position, wherein the first complementary position is closer to a beginning of the complementary bitline than the second complementary position;

means for exchanging charge between the bitline and the equalization potential at the second position on the bitline; and means for exchanging charge between the complementary bitline and the equalization potential at a corresponding second position on the complementary bitline.

7. The bitline equalization system of claim 6, further comprising:

means for exchanging charge between the first position on the bitline and the corresponding first position on the complementary bitline.

8. A bitline equalization system for pre charging a bitline and a complementary bitline to an equalization potential in a DRAM integrated circuit, the bitline equalization system comprising:

a first transistor having a first gate connected to a common equalization line, a first source connected to the first position along the bitline, and a first drain connected to the corresponding first position along the complementary bitline;

a second transistor having a second gate connected to the common equalization line, a second source connected to the first position along the bitline, and a second drain connected to the equalization potential;

a third transistor having a third gate connected to the common equalization line, a third source connected to the corresponding first position along the complementary bitline, and a third drain connected to the equalization potential;

a fourth transistor having a fourth gate connected to the common equalization line, a fourth source connected to the second position along the bitline, and a fourth drain connected to the corresponding second position along the complementary bitline, wherein the first position is closer to a beginning of the bitline than the second position, and wherein the first complementary position is closer to a beginning of the complementary bitline than the second complementary position;

a fifth transistor having a fifth gate connected to the common equalization line, a fifth source connected to the second position along the bitline, and a fifth drain connected to the equalization potential; and a sixth transistor having a sixth gate connected to the common equalization line, a sixth source connected to the corresponding second position along the complementary bitline, and sixth drain connected to the equalization potential.

9. A bitline equalization system for pre charging a bitline and a complementary bitline to an equalization potential in a DRAM integrated circuit, the bitline equalization system comprising:

a first equalization circuit connected between a first position along the bitline and a corresponding first position along the complementary bitline; and a second equalization circuit connected between a second position along the bitline and a corresponding second position along the complementary bitline, wherein the first position is closer to a beginning of the bitline than the second position, and wherein the first complementary position is closer to a beginning of the complementary bitline than the second complementary position, wherein the distance between the second position along the bitline and an end of the bitline is substantially the same as the distance between the first position along the bitline and a beginning of the bitline, and wherein the distance between the second complementary position along the complementary bitline and an end of the complementary bitline is substantially the same as the distance between the first complementary position along the complementary bitline and a beginning of the complementary bitline.

* * * * *